United States Patent [19]
Dassero et al.

[11] Patent Number: 5,822,640
[45] Date of Patent: Oct. 13, 1998

[54] CAMERA INCLUDING DUAL SIDED AUXILIARY CIRCUIT BOARD

[75] Inventors: William F. Dassero; Robert J. Stanchus, both of Rochester, N.Y.

[73] Assignee: Eastman Kodak Company, Rochester, N.Y.

[21] Appl. No.: 941,425

[22] Filed: Sep. 30, 1997

[51] Int. Cl.⁶ .................................................. G03B 17/00
[52] U.S. Cl. ........................................... 396/542; 396/543
[58] Field of Search ................................... 396/535, 542, 396/543

[56] References Cited

U.S. PATENT DOCUMENTS

| | | |
|---|---|---|
| 2,694,352 | 11/1954 | Babbs . |
| 3,021,422 | 2/1962 | Ogier et al. . |
| 3,133,488 | 5/1964 | Fritz . |
| 3,256,793 | 6/1966 | Denk et al. . |
| 3,446,951 | 5/1969 | Schmidt . |
| 3,484,597 | 12/1969 | Schmidt . |
| 3,599,553 | 8/1971 | Hansen et al. . |
| 3,603,781 | 9/1971 | Kobayashi et al. . |
| 3,611,896 | 10/1971 | Aoki . |
| 3,680,455 | 8/1972 | Meinuger . |
| 3,732,795 | 5/1973 | Fukuda et al. . |
| 3,741,097 | 6/1973 | Fukuda et al. . |
| 3,750,549 | 8/1973 | Waaske . |
| 3,810,227 | 5/1974 | Tanaka . |
| 3,823,411 | 7/1974 | Hasegawa et al. . |
| 3,839,607 | 10/1974 | Ogihara . |
| 3,938,170 | 2/1976 | Winkler et al. . |
| 3,964,078 | 6/1976 | Kurei et al. . |
| 3,988,752 | 10/1976 | Winkler et al. . |
| 4,096,506 | 6/1978 | Lange . |
| 4,132,471 | 1/1979 | Svatek et al. . |
| 4,148,573 | 4/1979 | Yamanaka . |
| 4,181,415 | 1/1980 | Uchiyama et al. . |
| 4,189,222 | 2/1980 | Maitani . |
| 4,199,235 | 4/1980 | Matsuda et al. . |
| 4,240,735 | 12/1980 | Maitani et al. . |
| 4,299,465 | 11/1981 | Chan . |
| 4,306,799 | 12/1981 | Johnson . |

(List continued on next page.)

FOREIGN PATENT DOCUMENTS

| | | |
|---|---|---|
| 28 03 034 | 8/1978 | Germany . |
| 49-63426 | 6/1974 | Japan . |
| 61-18500 | 9/1984 | Japan . |
| 5-210205 | 8/1993 | Japan . |
| 6-194724 | 7/1994 | Japan . |

OTHER PUBLICATIONS

EP 683450 Nov. 22, 1995 Computer Abstract.
JP 2158186 Jun. 18, 1990 Computer Abstract.
JP 2117191 May 01, 1990 Computer Abstract.
JP 1072538 Mar. 17, 1983 Computer Listing Title Only.
JP 62293688 Dec. 21, 1987 Computer Listing Title Only.

*Primary Examiner*—David M. Gray
*Attorney, Agent, or Firm*—Robert Luke Walker

[57] ABSTRACT

An efficient camera structure permits electrical components to be incorporated within a minimum amount of space. Specifically, a camera is provided that includes a main camera body, a main circuit board attached to a front portion of the main camera body, a dual sided auxiliary circuit board attached to a top portion of the main camera body, a switch element located between the main camera body and the auxiliary circuit board, and at least one electrical component located on a top surface of the auxiliary circuit board. In operation, the switch element contacts an electrical contact located on a bottom surface of the auxiliary circuit board. Electrical components can be attached to the top surface of the auxiliary circuit board. In a preferred embodiment, battery leads are located in slots formed in the auxiliary circuit board. The slots can be sized to create a mechanical snap fit between the battery leads and the slots. The utilization of both sides of the auxiliary circuit board to provide mounting space for electrical components and space for switching contacts enables the overall structure of the camera to be reduced while incorporating many different electrical circuit elements.

20 Claims, 15 Drawing Sheets

U.S. PATENT DOCUMENTS

| | | |
|---|---|---|
| 4,317,625 | 3/1982 | Allen . |
| 4,318,602 | 3/1982 | Yamanaka et al. . |
| 4,319,814 | 3/1982 | Iura et al. . |
| 4,350,420 | 9/1982 | Engelsmann et al. . |
| 4,356,533 | 10/1982 | Takematsu . |
| 4,356,538 | 10/1982 | Plummer . |
| 4,359,277 | 11/1982 | Shimizu et al. . |
| 4,412,276 | 10/1983 | Blinow . |
| 4,426,142 | 1/1984 | Iura et al. . |
| 4,441,799 | 4/1984 | Enomoto . |
| 4,451,130 | 5/1984 | Yan . |
| 4,460,942 | 7/1984 | Pizzuti et al. . |
| 4,494,850 | 1/1985 | Katsuma et al. . |
| 4,500,184 | 2/1985 | Morizumi et al. . |
| 4,500,191 | 2/1985 | Yamanaka . |
| 4,557,574 | 12/1985 | Kohno et al. . |
| 4,570,203 | 2/1986 | Daniels et al. . |
| 4,681,418 | 7/1987 | Kodaira . |
| 4,711,548 | 12/1987 | Arakawa et al. . |
| 4,796,168 | 1/1989 | Peterson . |
| 4,801,960 | 1/1989 | Hansen . |
| 4,937,609 | 6/1990 | Wakabayashi et al. . |
| 4,991,063 | 2/1991 | Stoneham . |
| 5,028,943 | 7/1991 | Ishii et al. . |
| 5,047,792 | 9/1991 | Asano et al. . |
| 5,047,900 | 9/1991 | DiRisio . |
| 5,050,044 | 9/1991 | Shibayama . |
| 5,105,213 | 4/1992 | Takahashi . |
| 5,146,251 | 9/1992 | Ishii et al. . |
| 5,235,364 | 8/1993 | Ohmura et al. . |
| 5,274,411 | 12/1993 | Kwak . |
| 5,307,113 | 4/1994 | Egawa . |
| 5,317,353 | 5/1994 | Kobayashi et al. . |
| 5,402,204 | 3/1995 | Yoshimura . |
| 5,521,670 | 5/1996 | Hara et al. . |
| 5,541,688 | 7/1996 | Glogan . |
| 5,608,478 | 3/1997 | Kamoda . |

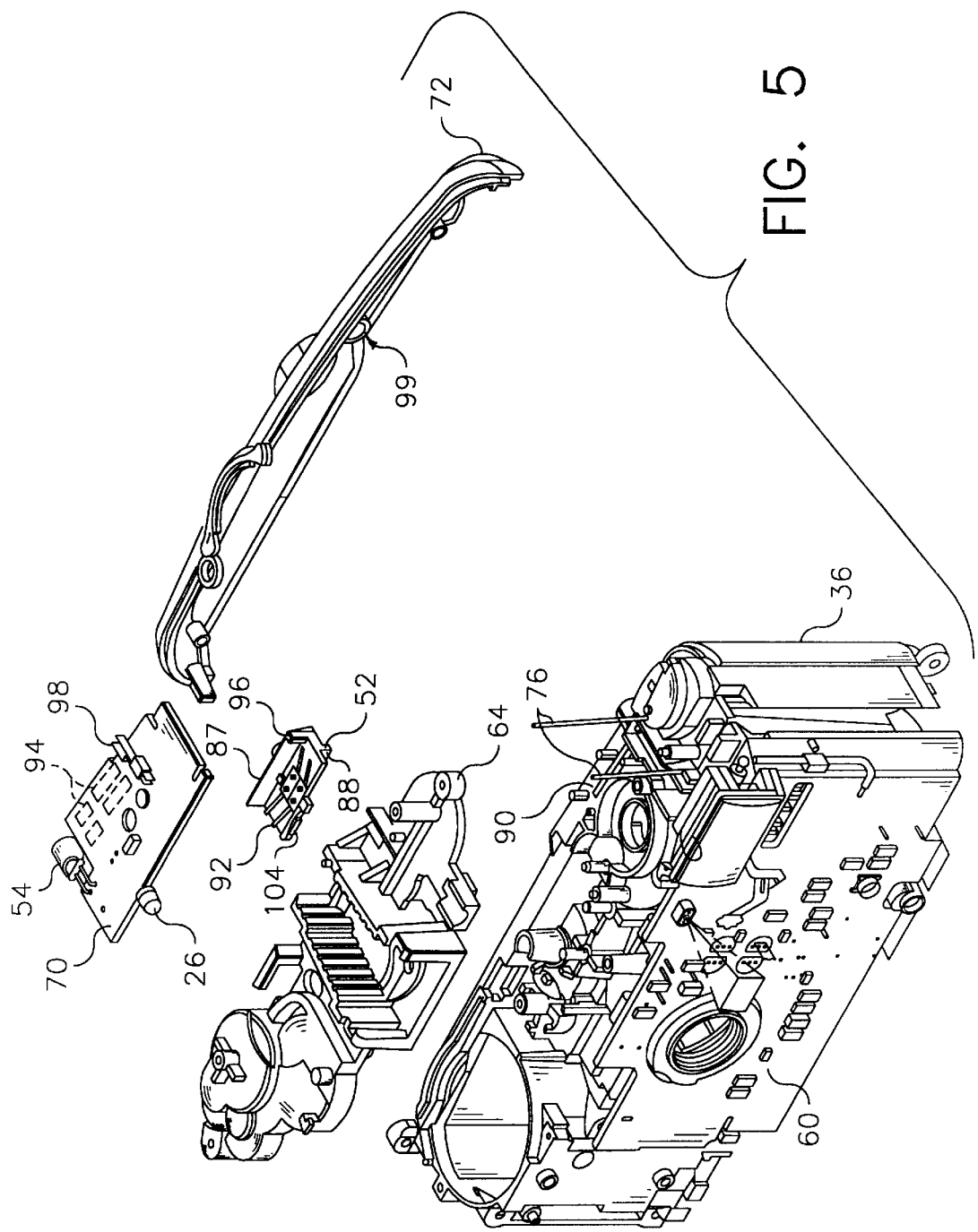

5,822,640

CAMERA INCLUDING DUAL SIDED AUXILIARY CIRCUIT BOARD

CROSS-REFERENCE TO RELATED APPLICATIONS

Reference is made to commonly assigned co-pending U.S. patent application Ser. No. 08/940,569, entitled: MINIATURE FLASH CIRCUIT SWITCH WITH HIGH CURRENT CAPABILITY, and filed in the names of Ronald W. Grant and William B. Salvas; Ser. No. 08/940,771, entitled: MULTIPLE FUNCTION SHUTTER BUTTON ASSEMBLY, and filed in the names of William B. Salvas, Ronald W. Grant, William F. Dassero, Dwight J. Petruchik and Donald P. McGinn; Ser. No. 08/940,725, entitled: FILL-FLASH/FLASH-DEFEAT SWITCH RETAINED BY ELECTRONIC FLASH UNIT, and filed in the names of Robert J. Stanchus and William F. Dassero; Ser. No. 08/941,525, entitled: CAMERA HAVING SELF TIMER UNWIND WITHOUT EXPOSURE, and filed in the names of William B. Salvas and William F. Dassero; Ser. No. 08/940,423, entitled: CAMERA HAVING SELF TIMER DWELL, and filed in the names of William B. Salvas, Robert J. Stanchus and William F. Dassero; Ser. No. 08/941,778, entitled: CAMERA AND MECHANICAL SELF TIMER, and filed in the names of William B. Salvas and Ronald W. Grant, each of which are assigned to the assignee of this application.

FIELD OF THE INVENTION

The invention relates in general to camera structures. In particular, the invention relates to a camera structure that includes a dual sided auxiliary circuit board.

BACKGROUND OF THE INVENTION

It is desirable to provide a camera having a variety of functions that are performed by electrical circuits, subassemblies and discrete components. Although great advances have been made in reducing the size of integrated circuit components while vastly improving the number of transistors contained therein, various other electrical components such as electronic flash units, batteries, indicator lamps and sensor elements cannot be significant reduced in size. Thus, as a greater number of electrical functions are added to camera structures, it becomes more and more difficult to provide and efficient and effective layout of the electrical components that minimizes the overall size of the camera structure.

In view of the above, it is an object of the invention to provide an efficient camera structure that permits a multitude of electrical components to be incorporated within a minimum amount of space.

SUMMARY OF THE INVENTION

The invention provides an efficient camera structure that permits electrical components to be incorporated within a minimum amount of space. Specifically, a camera is provided that includes a main camera body, a main circuit board attached to a front portion of the main camera body, a dual sided auxiliary circuit board attached to a top portion of the main camera body, a switch element located between the main camera body and the auxiliary circuit board, and at least one electrical component located on a top surface of the auxiliary circuit board. In operation, the switch element contacts an electrical contact located on a bottom surface of the auxiliary circuit board. Electrical components, such as an indicator lamp and a red-eye reduction lamp, can be attached to the top surface of the auxiliary circuit board. In a preferred embodiment, battery leads are located in slots formed in the auxiliary circuit board. The slots can be sized to create a mechanical snap fit between the battery leads and the slots.

The utilization of both sides of the auxiliary circuit board to provide mounting space for electrical components and space for switching contacts enables the overall structure of the camera to be reduced while incorporating many different electrical circuit elements. Other features and advantages of the invention will become apparent to those skilled in the art after review of the following detailed description of the preferred embodiment and the accompanying drawings.

BRIEF DESCRIPTION OF THE DRAWINGS

The invention will be described in greater detail with reference to certain preferred embodiments thereof and the accompanying drawings, wherein:

FIG. 5 is a partial exploded view of the camera illustrated in FIG. 1;

DETAILED DESCRIPTION OF THE PREFERRED EMBODIMENTS

Figure 1:
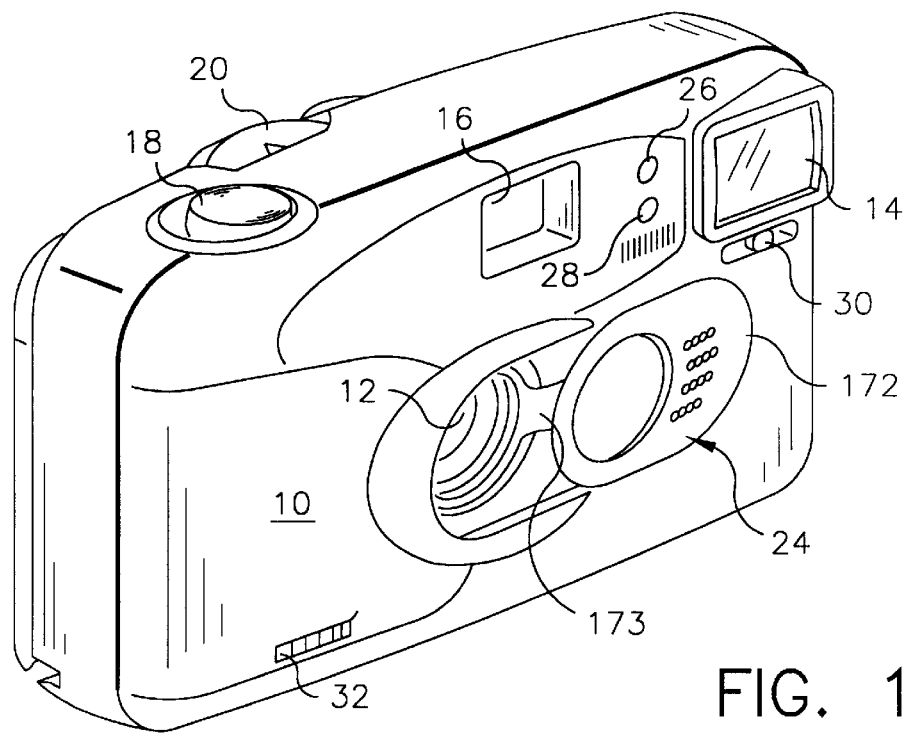
FIG. 1 is a front perspective view of a photographic camera in accordance with the invention.

FIG. 1 illustrates a photographic camera in accordance with the invention that includes a front housing cover 10, a lens 12, an electronic flash unit 14, an optical viewfinder 16, a shutter button assembly 18 and a mechanical exposure counter 20. A sliding lens cover assembly 24 is mounted to the front housing cover 10, such that movement of the sliding lens cover assembly 24 from a closed position to an open position activates electronic control circuitry of the photographic camera as will be described in greater detail. A red-eye reduction lamp 26, an electronic flash sensor 28 and a fill-flash/flash-defeat control switch assembly 30 are preferably located adjacent to the electronic flash unit 14 as illustrated. A self-timer control button 32 is also preferably provided on the front of the camera to control the operation of a mechanical or electrical self-timer unit contained within the main body of the camera.

Figure 2:
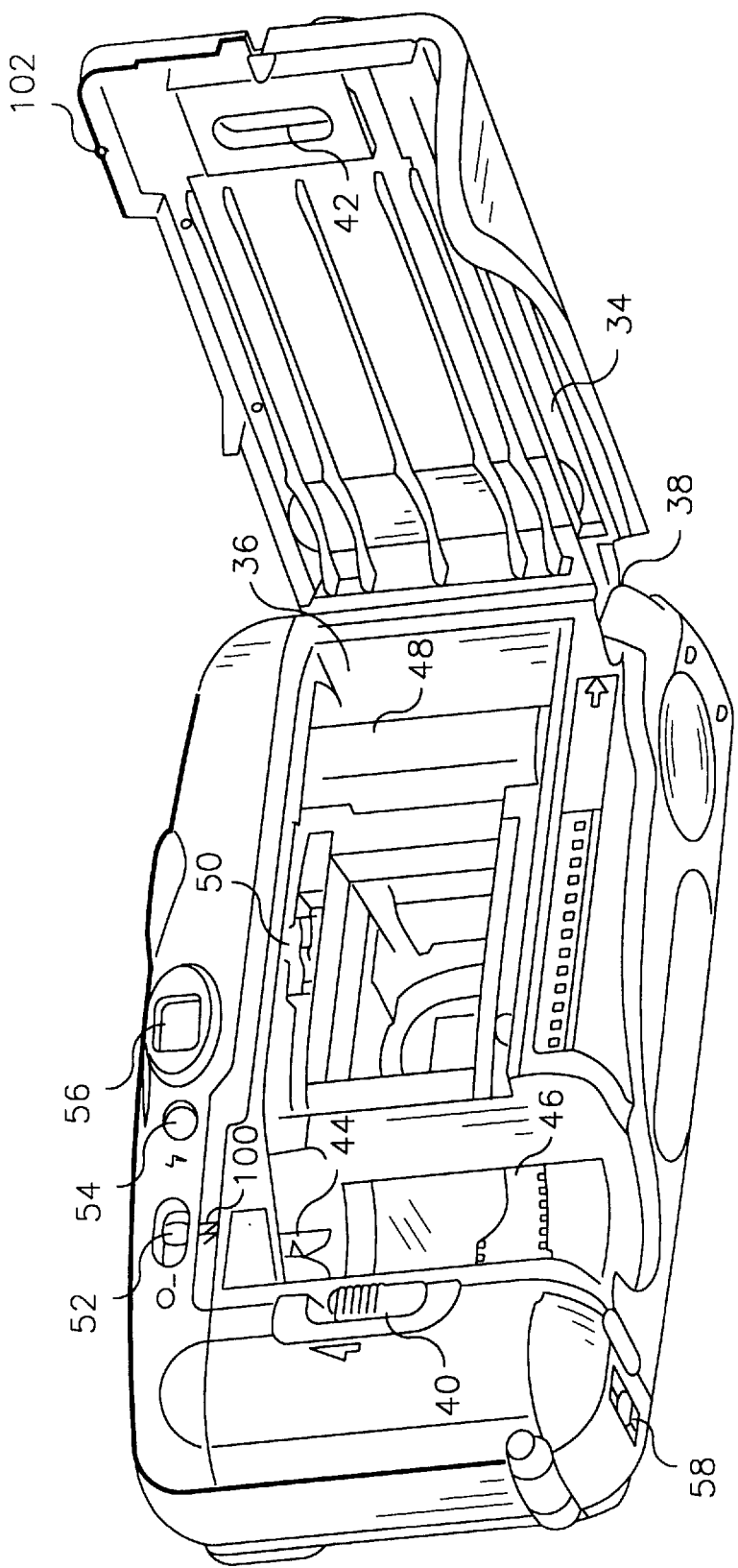
FIG. 2 is a rear perspective view of the photographic camera illustrated in FIG. 1.

FIG. 2 illustrates a back view of the camera shown in FIG. 1 with a film door 34 located in an open position. The film door 34 is coupled to a main camera frame 36 by a hinge assembly 38 and latched in a closed position by a latching mechanism 40 in a conventional manner. The film door 34 preferably includes a film window 42 that provides a camera operator with a view of the film chamber 46 of the camera in which a film spindle 44 is located. Film is advanced from a film canister loaded on the film spindle 44 in the film chamber 46 to a film take-up spool 48 by a motorized drive unit (not shown), and is maintained in proper position along a film transport path between the film chamber 46 and film take-up spool 48 by a film sprocket assembly 50. The film sprocket assembly 50 also serves to reset the camera's shutter mechanism and act as a detent for the mechanical exposure counter 20. A film rewind control switch 52 is provided to cause the motorized drive unit to drive the film spindle 44 in a rewind direction when activated by the camera operator. Other illustrated features include a flash-ready indicator lamp 54 located adjacent to an optical viewfinder eyepiece 56 and a hinged battery compartment door 58.

Figure 3:
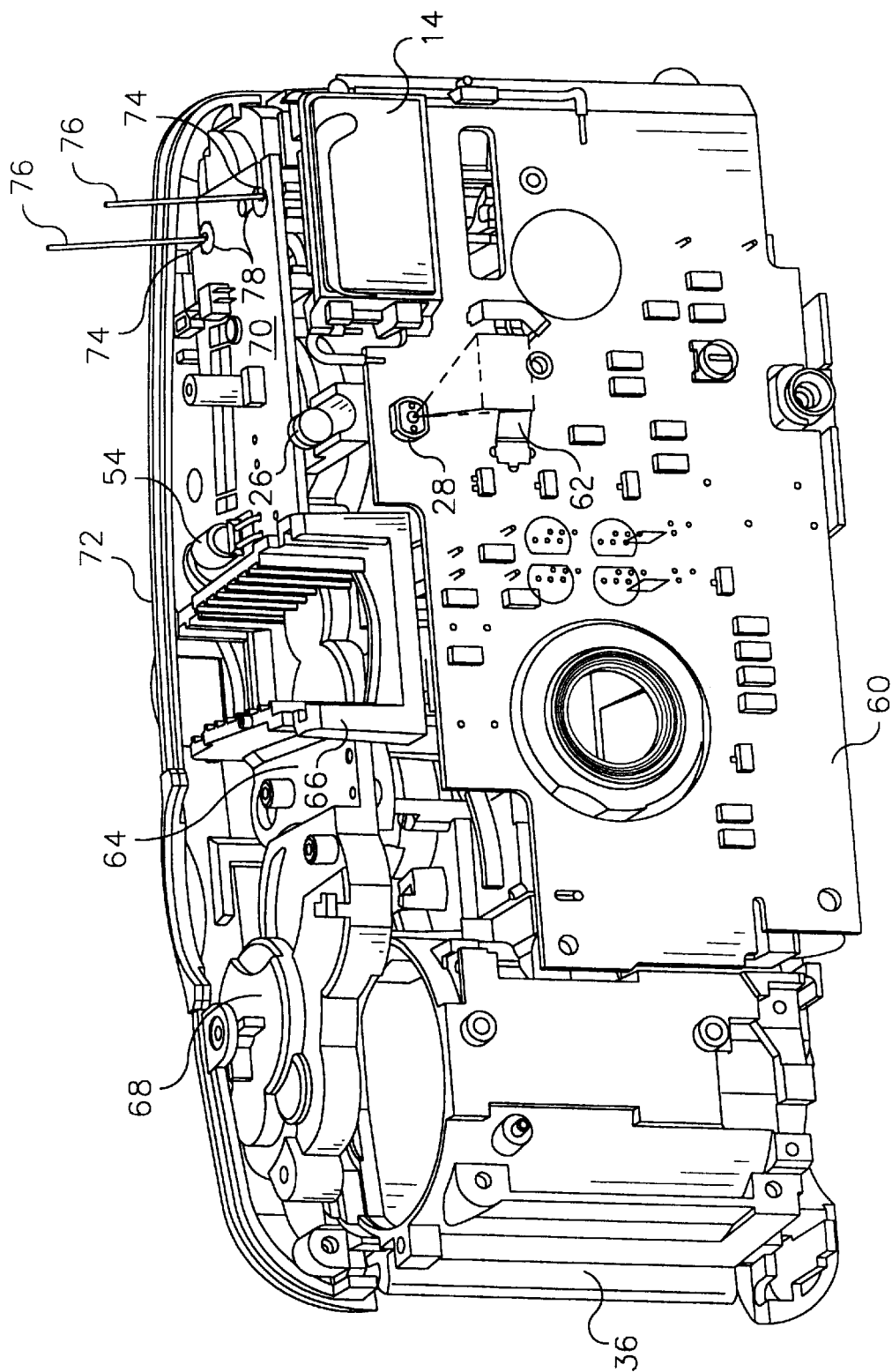
FIG. 3 is a front view of the camera illustrated in FIG. 1 with the front housing cover removed.

FIG. 3 illustrates a front view of the camera with the front housing cover 10 removed. A main printed circuit board 60 is attached to a front portion of the main camera frame 36. Various electronic control circuits for the camera, including a main camera control processor and flash control circuitry, are located on the main printed circuit board 60. In addition, discrete circuit elements, such as the electronic flash sensor 28 and an electronic flash operation control switch 62, are also located on the main printed circuit board 60. A mechanical plate 64 is attached to a top portion of the main camera frame 36 that includes a viewfinder retainer structure 66 and a motorized drive unit housing 68, respectively utilized to retain optical elements of the optical viewfinder 16 and a gear train of the motorized drive unit (not shown). An auxiliary printed circuit board 70 is also attached to the top portion of the main camera frame 36, such that a plane defined by the auxiliary printed circuit board 70 is substantially perpendicular to a plane defined by the main printed circuit board 60. The auxiliary printed circuit board 70 is preferably utilized to retain the red-eye reduction lamp 26 and the flash ready indicator lamp 54 (preferably a neon lamp), as well as providing electrical coupling to battery leads 76. A rear housing cover 72 is also attached to a rear portion of the main camera frame 36.

In order to aid in the assembly of the overall camera structure, the auxiliary printed circuit board 70 includes slots 74 that are utilized to retain the battery leads 76. The battery leads 76 extend into a battery compartment of the camera located below the auxiliary printed circuit board 70 and behind the electronic flash unit 14. The slots 74 and battery leads 76 are preferably sized to provide a mechanical "snap" fit, such that the battery leads 76 are physically held in place by the slots 74. The use of a mechanical snap fit for the slots 74 and battery leads 76 greatly simplifies the manufacturing process, by allowing the battery leads 76 to be properly located and held in place until a soldering operation can be performed to connect the battery leads 76 to electrical leads 78 that are provided, either adjacent to or immediately surrounding the slots 74, on the auxiliary printed circuit board 70. Any excess in the length of the battery leads 76 is preferably trimmed once the soldering operation is completed. Although a mechanical snap fit is preferred to physically hold the battery leads 76 in place while awaiting a soldering operation, the battery leads 76 need only be retained within the slots 74 in a manner to permit the proper soldering of the battery leads 76 to the electrical leads 78.

Figure 4:
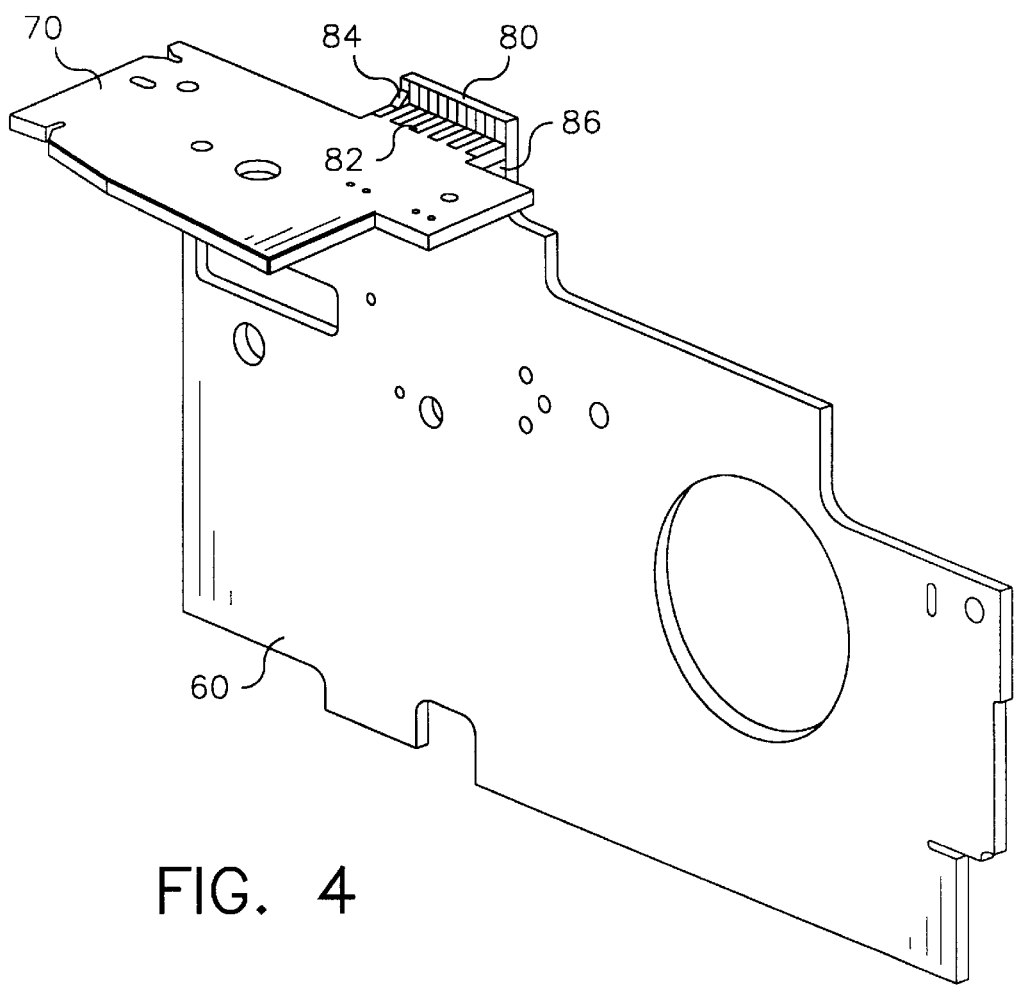
FIG. 4 illustrates the electrical coupling of a main printed circuit board and an auxiliary printed circuit board incorporated in the camera of FIG. 1 utilizing abutting electrical contacts.

The main printed circuit board 60 and the auxiliary secondary printed circuit board 70 are electrically coupled together to permit the transfer of electrical control and power signals between the two circuit boards. Conventional techniques such as flexible circuits, ribbon cables or discrete wires can be utilized to provide the required electrical coupling. In order to greatly simplify the manufacturing process, however, it would be preferred that electrical leads of the main printed circuit board 60 and the auxiliary printed circuit board 70 be directly coupled. FIG. 4 illustrates an embodiment of the invention in which the main printed circuit board 60 and the auxiliary printed circuit board 70 are located substantially perpendicular, such that electrical leads 80 on the main printed circuit board 60 perpendicularly abut electrical leads 82 on the auxiliary printed circuit board 70. A soldering operation is then performed to connect the electrical leads 80 to the electrical leads 82 with a solder connection joint 84 located at the junction of the perpendicular abutment. The use of the perpendicularly abutting electrical leads 80, 82 reduces the time required to solder the connections between the main printed circuit board 60 and the auxiliary printed circuit board 70 as compared with the time generally required to solder flexible circuits or discrete wires. It should be noted that the electrical leads 82 of the auxiliary printed circuit board 70 could also be located on a lower surface thereof, as viewed in the FIG. 4, such that the solder connection joint 84 would be located at a connection point 86 underneath the auxiliary printed circuit board 70. In such an embodiment, the portion of the main printed circuit board 60 containing the electrical leads 80 would not have to extend past the auxiliary printed circuit board 70 as shown in FIG. 4, but instead, would terminate at the upper surface of the auxiliary printed circuit board 70. Other variations, of course, are possible depending on the layout of the main and auxiliary printed circuit boards 60, 70 within the main body of the camera.

FIG. 5 illustrates a partial exploded view of the camera structure illustrated in FIG. 3. As can be seen in FIG. 5, the film rewind control switch 52 is located between the auxiliary printed circuit board 70 and the main camera frame 36, and includes a main switch body 87 having a flexible slide element 88 that fits into a slot 90 ion of the main camera frame 36. Electrical contact wiper elements 92 are provided on a top surface of the main switch body 87. The electrical contact wiper elements 92 come into contact with electrical contacts 94 (shown by dotted lines) located on the bottom side of the auxiliary printed circuit board 70, as the film rewind control switch 52 is moved back and forth between an initial position and a film rewind position. An extension member 96 is also provided as part of the main switch body 87. The extension member 96 contacts and activates a switch element 98 provided on the top surface of the secondary printed circuit board 70. In the illustrated embodiment, the switch element 98 constitutes a portion of a current drain protection circuit. Accordingly, in the illustrated embodiment, the film rewind control switch 52 interacts with circuit elements on both sides of the auxiliary printed circuit board 70 to provide a compact and efficient design. The positioning of the auxiliary printed circuit board 70 with respect to the film rewind control switch 52 permits the flash-ready indicator lamp 54 to be readily aligned with an indicator lamp hole 99 located on the rear cover housing 72 of the camera.

Figure 6:
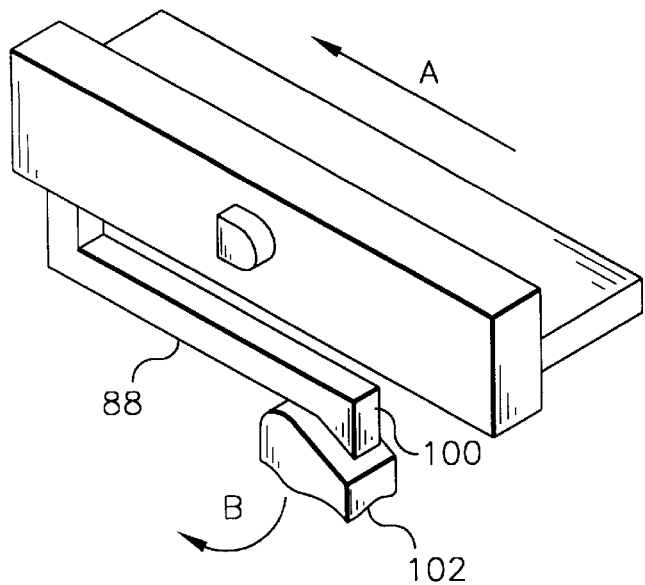
FIG. 6 is a perspective view of a film rewind control switch utilized in the camera illustrated in FIG. 1.

An interface is provided between the film rewind control switch 52 and the film door 34 to reset the film rewind control switch 52 to the initial position when the film door 34 is opened to remove rewound film. Specifically, as shown in FIG. 6, the flexible slide element 88 includes a ramped end 100 that rides over and snaps in place behind a stop mechanism 102 provided on the film door 34, when the film door 34 is closed and the film rewind control switch 52 is moved to the film rewind position in the direction indicated by the arrow "A". When the film door 34 is opened, the stop mechanism 102 is pulled out of the path of the flexible slide element 88 along the path indicated by arrow "B", and the film rewind control switch 52 is pulled back to its initial position by a biasing spring 104 shown in FIG. 5. The relative positioning of the ramped end 100 of the flexible slide element 88 and the stop mechanism 102 when the film door is opened is shown in FIG. 1.

Figure 7:
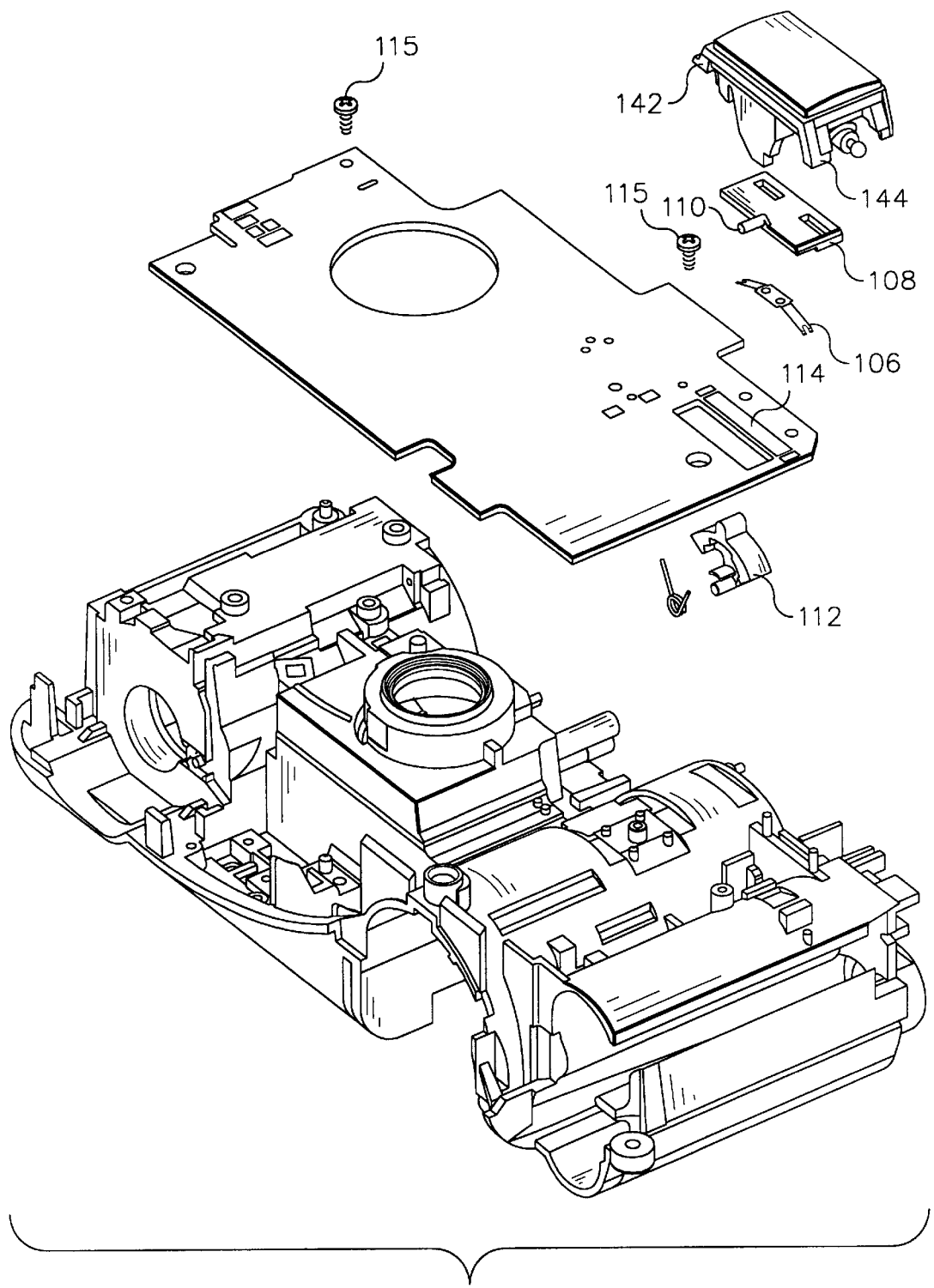
FIG. 7 is a partial exploded view of the attachment of an electronic flash unit to a main camera frame illustrated in FIG. 3.
Figure 8:
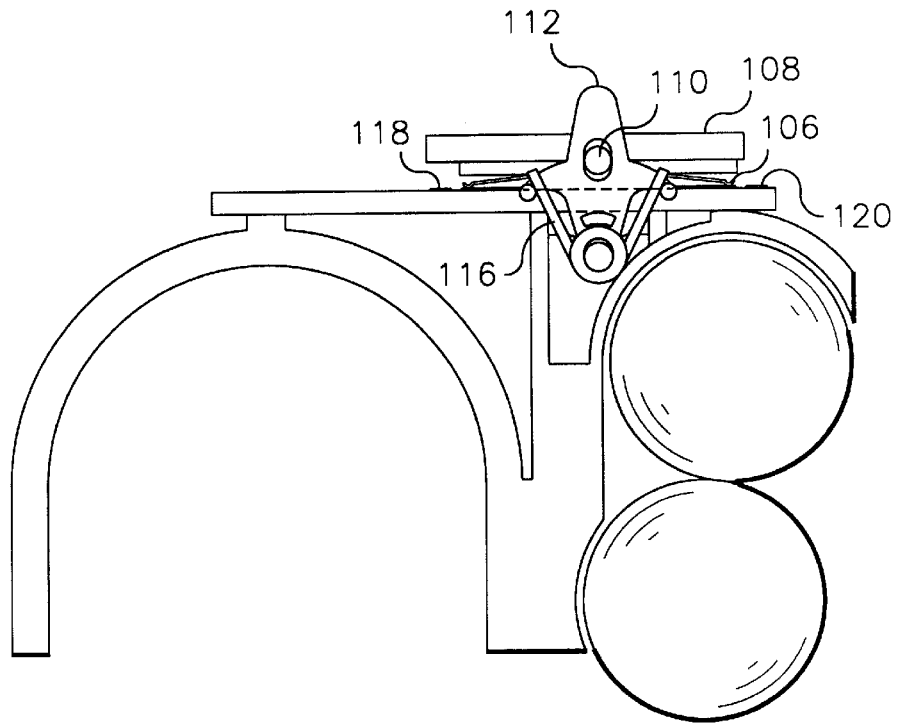
FIGS. 8 and 9 are bottom views illustrating the operation of a fill-flash/flash-defeat switch element utilized in the camera illustrated in FIG. 1.
Figure 9:
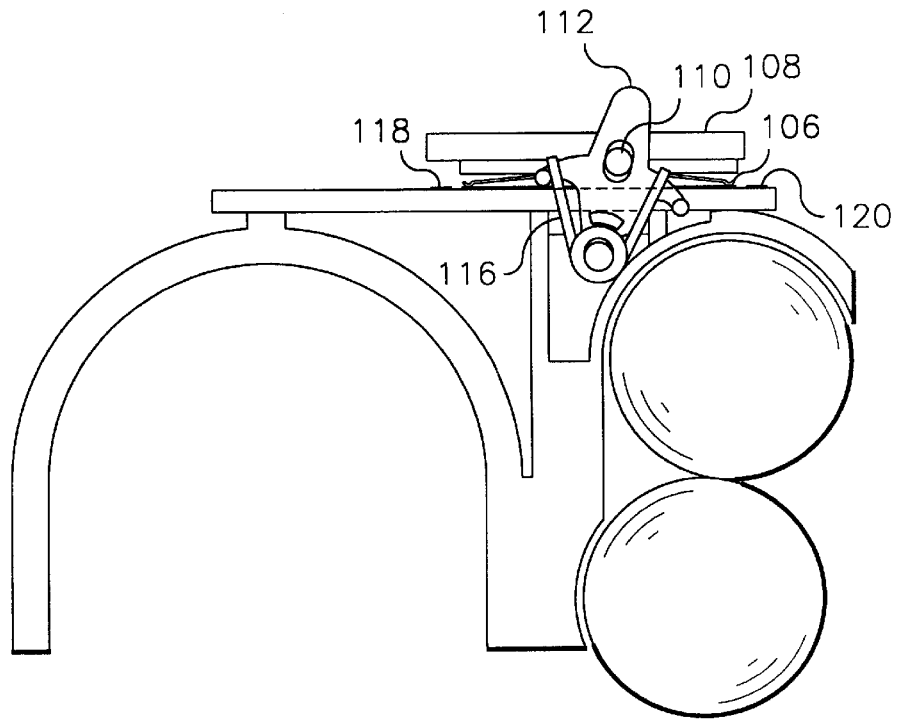

FIG. 7 illustrates a partial exploded view of the camera structure illustrated in FIG. 3 detailing the assembly of the electronic flash unit 14 and the fill-flash/flash-defeat control switch assembly 30 with respect to the main camera frame 36 and the main printed circuit board 60. The main printed circuit board 60 includes an electrical contact group 114 located on a front surface thereof that is utilized to provide signals corresponding to the operation of the fill-flash/flash-defeat control functions of the camera. An electrical contact wiper element 106 is coupled to a wiper carrier assembly 108, which includes a post element 110 that is captured in a slot provided in the fill-flash/flash-off switch element 112. As shown in FIG. 8, the fill-flash/flash-off switch element 112 is pivotally mounted to the main camera frame 36 and is biased to a neutral position by a spring element 116 as shown. Movement of the fill-flash/flash-defeat switch element 112 imparts a force to the post 110 of the wiper carrier assembly 108 causing the wiper carrier assembly 108, including the electrical contact wiper element 106 coupled thereto, to move laterally back and forth to selectively bring the electrical contact wiper element 106 into contact with either the left electrical contact 118 (to supply a fill flash condition signal to a control circuit of the camera) or the right electrical contact 120 of the electrical contact group 114 as illustrated in FIG. 9 (to supply a flash defeat condition signal to the control circuit of the camera).

Figure 10:
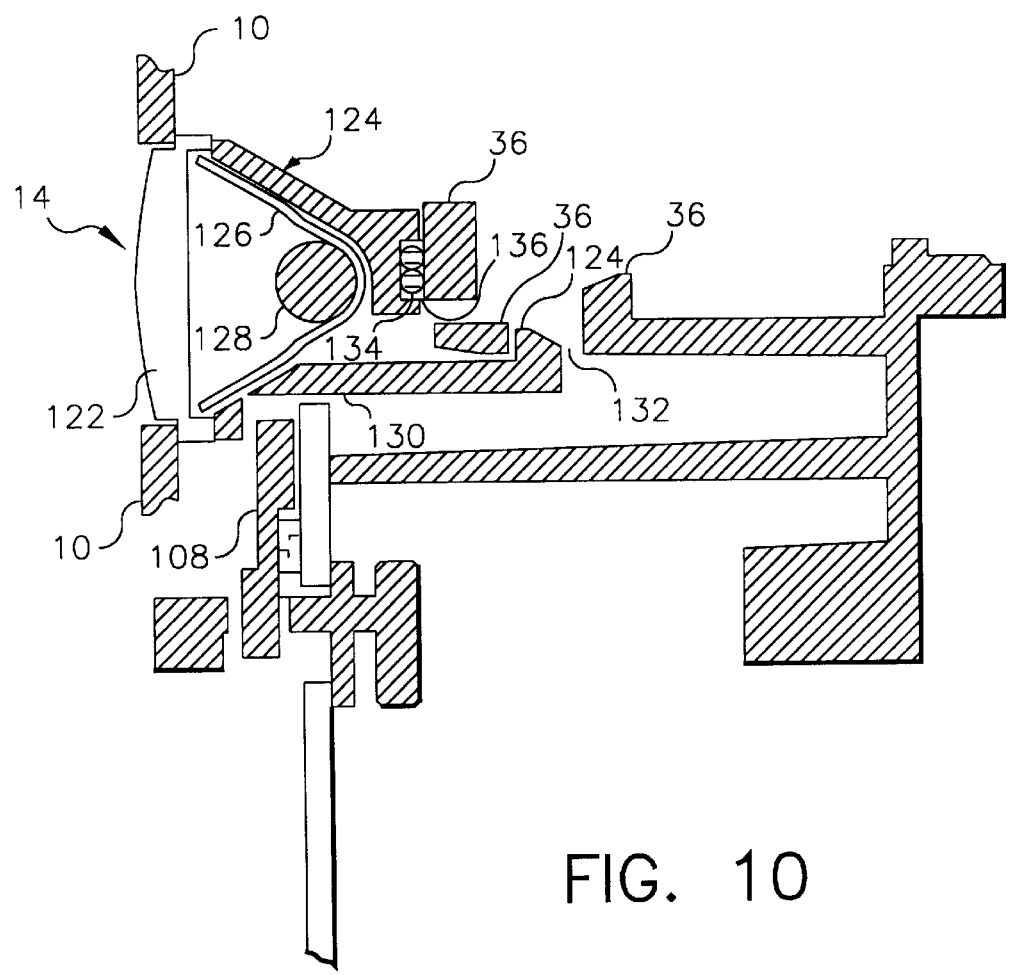
FIG. 10 is a side view illustrating the attachment of a wiper carrier assembly and an electronic flash unit.
Figure 11:
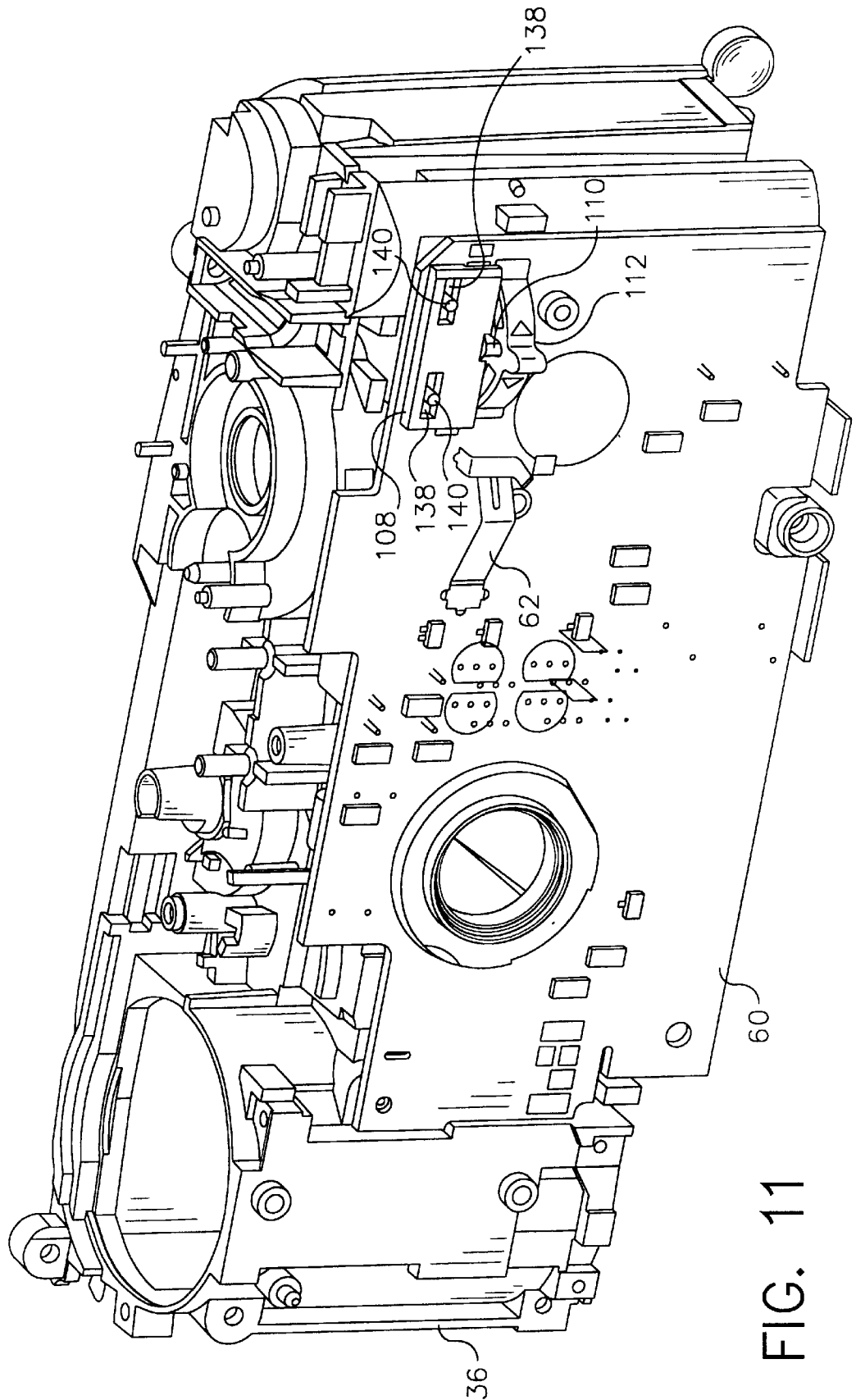
FIG. 11 is a perspective front view of the camera illustrated in FIG. 3 with the wiper carrier assembly shown in place.

The top portion of the wiper carrier assembly 108 is held in place against the main printed circuit board 60 primarily by the electronic flash unit 14. As shown in the FIG. 10, the electronic flash unit 14 includes a transparent cover 122 that snaps onto a reflector mounting structure 124. A reflector plate 126 and a flash tube 128 are retained within the reflector mounting structure 124. The reflector mounting structure 124 includes a flexible extension arm 130 that snaps into a relief opening 132 provided in the main camera frame 36. The entire flash unit 14 is resiliently biased outward into position against the front camera housing 10 by an elastic band 134 that is looped around the ends of the flash tube 128 (indicated by dashed line) and passes between the reflector mounting structure 124 and the main camera frame 36 in a channel 136. As shown in FIG. 11, which provides a view with the electronic flash unit 14 removed, guide openings 138 are provided to permit the wiper carrier assembly 108 to slide back and forth over guide ribs 140 that extend from the main camera frame 36. The sequence of assembly includes mounting the fill-flash/flash-defeat switch element 112 to the main camera frame 36, mounting the main circuit board 60 onto the main camera frame 36 with mounting screws 115 to locate and retain the fill-flash/flash-defeat switch element 112 in place, positioning the wiper carrier assembly 108 so that the post 110 is captured by the fill-flash/flash-defeat switch element 112 and locating the guide ribs 140 within the guide openings 138, and snapping the reflector mounting structure 124 into the main camera frame 36. The overall structure is simple to assemble without requiring mechanical fasteners other than the screws 115 used to attach the main circuit board 60 to the main camera frame 36.

Figure 12:
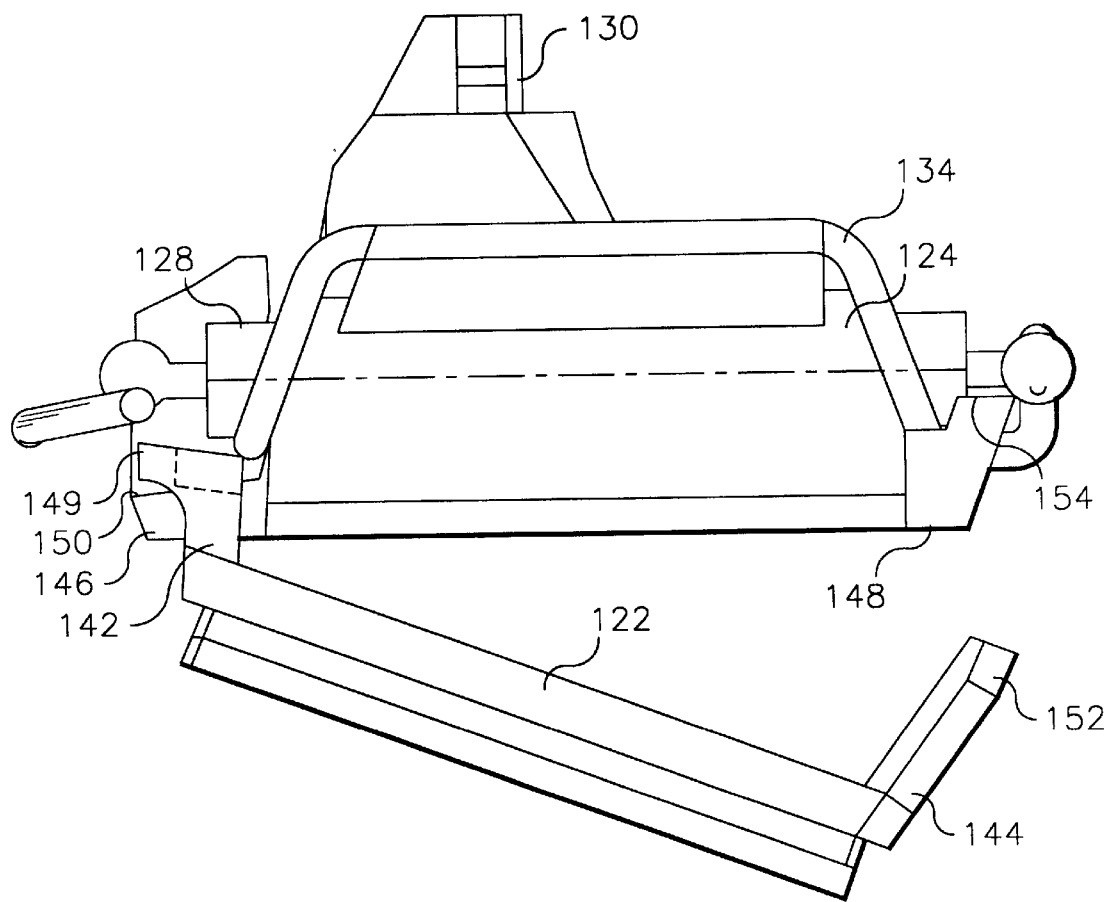
FIG. 12 is a top view illustrating the attachment of a transparent cover to a reflector body structure of the flash unit illustrated in FIG. 10.

The transparent cover 122 is also provided with a mechanism to permit easy attachment to the reflector mounting structure 124. As shown in FIG. 12, a first side of a top edge of the transparent cover 122 is provided with an "L" shaped leg 142 and a second side of the top edge of the transparent cover 122 is provided with a substantially straight leg 144 that is longer than the L-shaped leg 142. An identical L-shaped leg 142 and an identical straight leg 144 are also provided at a bottom edge of the transparent cover 122 as shown in FIG. 7. The reflector mounting structure 124 is provided with a straight extension portion 146 and an angled extension portion 148 that respectively correspond to the L-shaped leg 142 and the straight leg 144 of the transparent cover 122. During assembly, the transparent cover 122 is engaged with a first side of the reflector mounting structure 124 such that the L-shaped leg 142 extends over the straight extension portion 146 as shown in FIG. 12. A hook protrusion 149 extending downward from the tip of the L-shaped leg 142 (or upward in the case of the lower leg illustrated in FIG. 7) is placed behind a back surface 150 of the straight extension portion 146. Accordingly, the L-shaped leg 142 pivots on the straight extension portion 146 in a hinged manner, thereby allowing the straight leg 144 to be rotated toward the angled extension portion 148 of the reflector mounting structure 124. A hook protrusion 152 extending downward from the straight leg 144 latches over a back edge 154 of the angled extension portion 148 to secure the transparent cover 122 to the reflector mounting structure 124 with a snap fit that prevents contaminants from entering the electronic flash unit 14.

Figure 14:
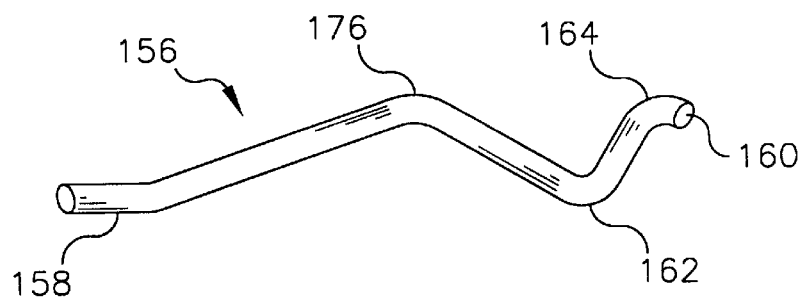
FIG. 14 illustrates the structure of a leaf spring switch element.
Figure 13:
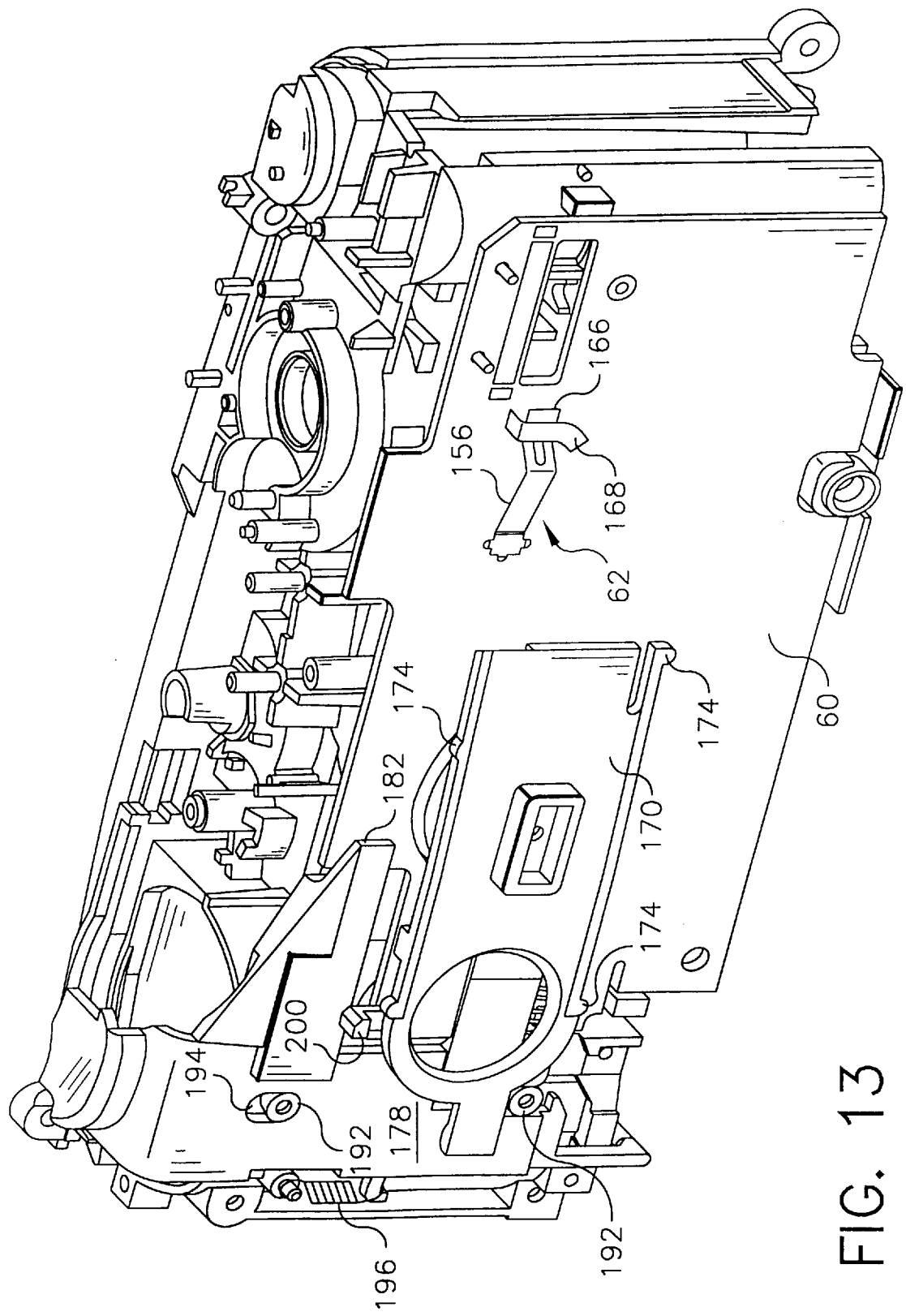
FIG. 13 is a front perspective view of the camera illustrated in FIG. 3 with an internal slide member of a sliding lens cover assembly located in a closed position.

The specifics of the flash operation control switch 62 will now be described with reference to FIGS. 13–15, 21 and 22. The flash operation control switch 62 includes a leaf spring switch element 156 that is attached to the main circuit board 60 at a first end 158 and has a second end 160 that is shaped to form first and second opposing contact points 162, 164 as shown in FIG. 14. The second end 160 of the leaf spring switch element 156, including the first and second opposing contact points 162, 164, is located between an electrical contact pad 166 provided on the main printed circuit board 60 and a "bridge" contact 168 that is coupled to the main printed circuit board 60 at both ends, so that the bridge contact 168 extends up and over the second end 160 of the leaf spring switch element 156 as shown in FIG. 13. The leaf spring switch element 156 is biased upward so that a second opposing contact point 164 comes into electrical contact with the bridge contact 168 when the sliding lens cover 24 is in the closed position. In a preferred embodiment illustrated in FIG. 21, the leaf spring switch element 156 is configured to act as a double-throw-single-pole switch to disable a flash charger circuit for the electronic flash unit 14 and to turn off the flash ready indicator lamp 54. The flash charger circuit and the flash ready indicator lamp 54 are turned on when the leaf spring switch element 156 is pushed downward so that the first opposing contact point 162 makes contact with the contact pad 166.

Figure 15:
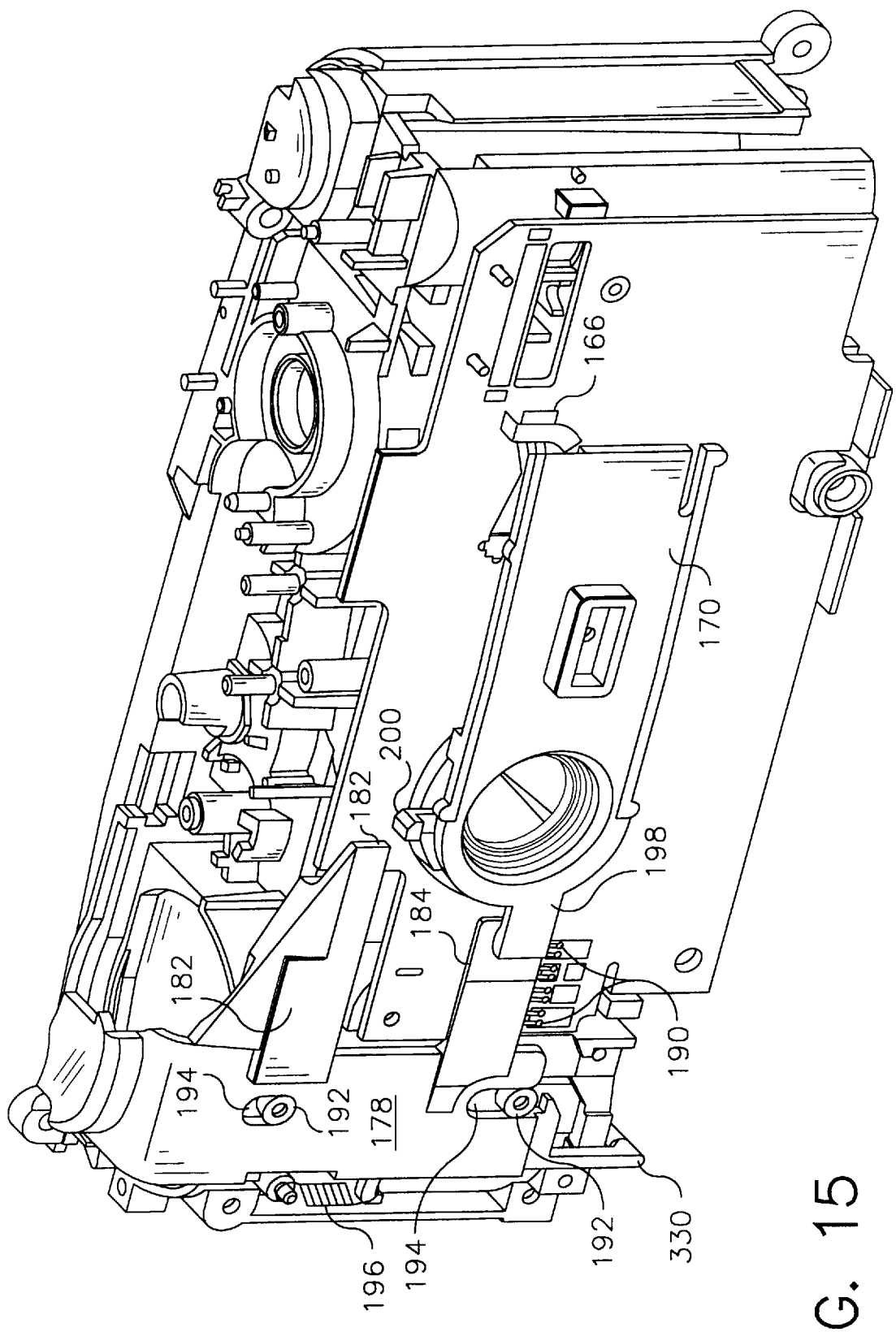
FIG. 15 is a front perspective view of the camera illustrated in FIG. 3 with an internal slide member of a sliding lens cover assembly located in an open position.

The leaf spring switch element 156 is controlled by the sliding lens cover assembly 24. Specifically, the sliding lens cover assembly 24 includes an interior slide plate 170 that is coupled to an exterior slide plate 172 by a screw that slides within a slot 173 provided in the front housing cover 10 (See FIG. 1). The interior slide plate 170 includes guide protrusions 174 that ride on ridges provided on the inside of the front housing cover 10. When the sliding lens cover assembly 24 is moved from the closed position shown in FIG. 13 to an open position as shown in FIG. 15, the slide plate 170 comes into contact with an upwardly extending contact point 176 of the leaf spring switch element 156, and pushes downward on the contact point 176 shown in FIG. 14 to move the first opposing contact point 162 into contact with the electrical contact pad 166 provided on the main printed circuit board 60 with a force of approximately five ounces.

The simple design of the leaf spring switch element 156 can easily handle currents in excess of two amps. The illustrated embodiment, for example, utilizes a leaf spring switch element 156 manufactured from beryllium copper having a width of 3.5 mm, a thickness of 0.13 mm and a length of approximately 15 mm that switches between five and six amps of current. Greater current capacities are also possible depending on type and dimensions of the material utilized. In desired, the second end 160 of the leaf spring switch element 156 is also slit to provide multiple contact points, with each contact point being capable of handling the full current capacity of the leaf spring switch element 156, thereby if one contact point becomes damaged or dirty.

Figure 22:
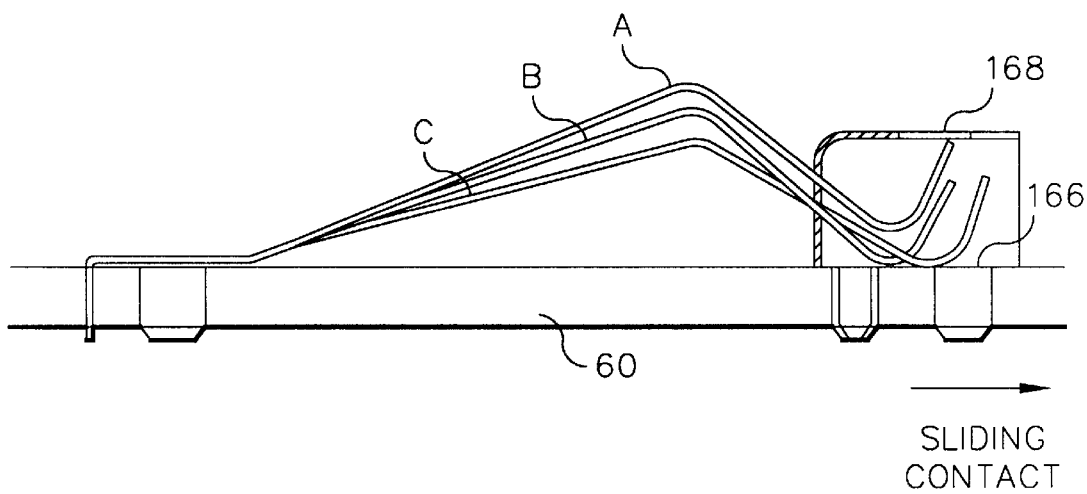
FIG. 22 is a side view of the flash operation control switch in different operating positions.

Another advantage to the leaf spring switch element 156 is the ability to clean contact surfaces during operation by providing a sliding contact motion. FIG. 22 illustrates multiple positions of the leaf spring switch element 156 during operation. In position A, the sliding lens cover assembly 24 is in the closed position such that the first opposing contact point 164 of the leaf spring switch element 156 is in contact with the bridge contact 168. As the sliding lens cover assembly 24 is moved to the opened position, contact is made with the contacting point 176 and a downward force is applied to the leaf spring switch element 156 until the first opposing contact 162 comes into contact with the electrical contact pad 166 at an intermediate position B. The sliding lens cover assembly 24 continues to apply a force that causes the first opposing contact 162 to slide of the surface of the electrical contact pad 166, thereby causing a frictional contact that cleans the surfaces of the first opposing contact 162 and the electrical contact pad 166, until a final contact position C is reached.

Figure 16:
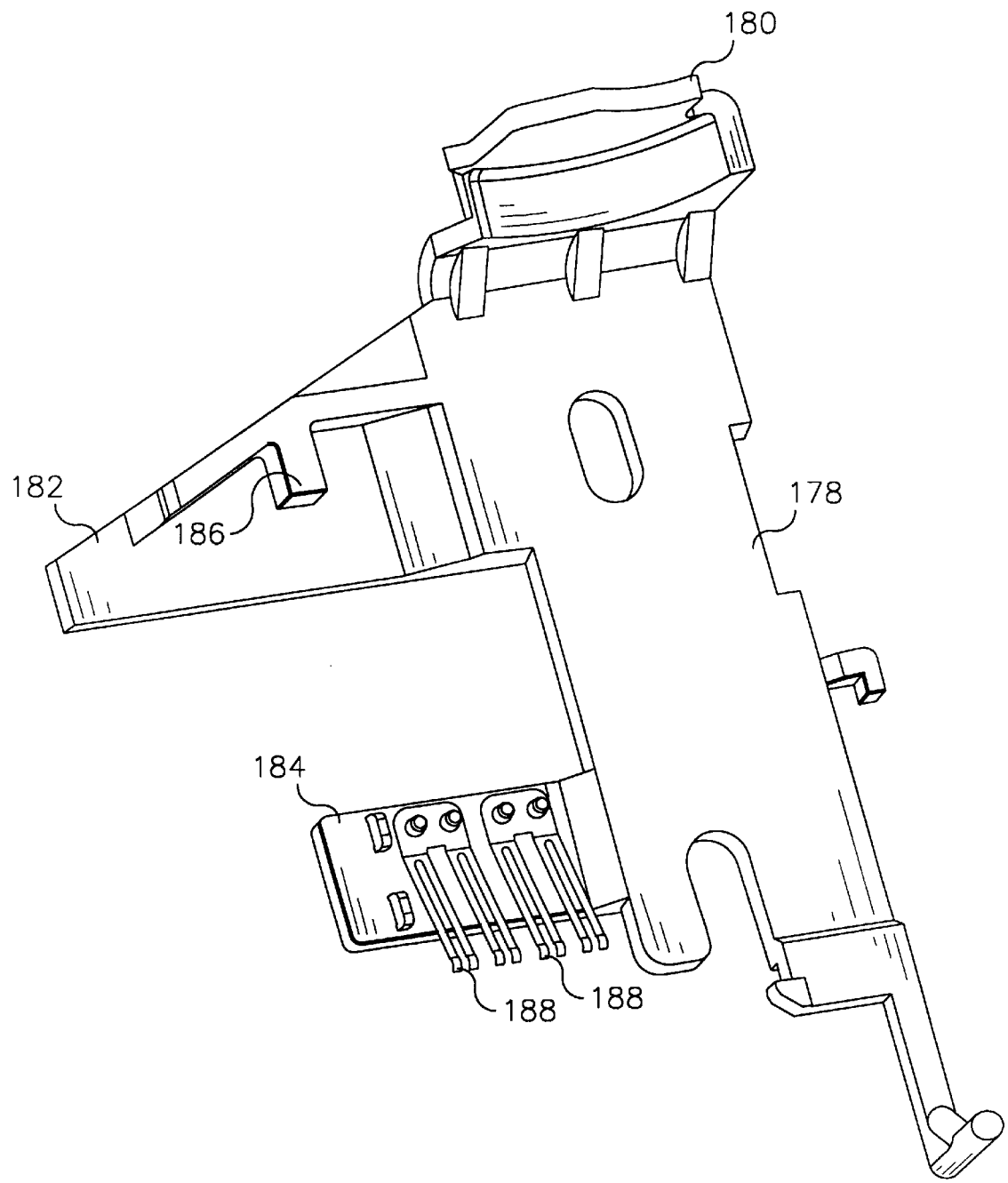
FIG. 16 illustrates a shutter button assembly.

The operation of the shutter button assembly 18 will now be described with reference to FIGS. 13, 15 and 16. As shown in FIG. 16, the shutter button assembly 18 includes a vertical sliding member 178 including a shutter button arm 180, a shutter actuation arm 182 and an electrical contact arm 184. The shutter actuation arm 182 includes a shutter actuation member 186 that contacts a shutter release device (either a mechanical member or an electrical switch) located on the main camera frame 36, when the vertical sliding member 178 is pushed downward by the application of a force to the shutter button arm 180 by a camera operator. As the vertical sliding member 178 moves downward, and before the shutter actuation member 182 contacts the shutter release device, electrical contact wiper elements 188 provided on the electrical contact arm 184 are moved downward into contact with electrical contact pads 190 provided on the main printed circuit board 60 as shown in FIG. 15. The electrical contact pads 190 are arranged to cause a sequence of signals to be provided to the electrical control circuits of the camera so that various pre-exposure operations can be performed prior to activation of the shutter release device by the shutter actuation member 182.

Figure 17:
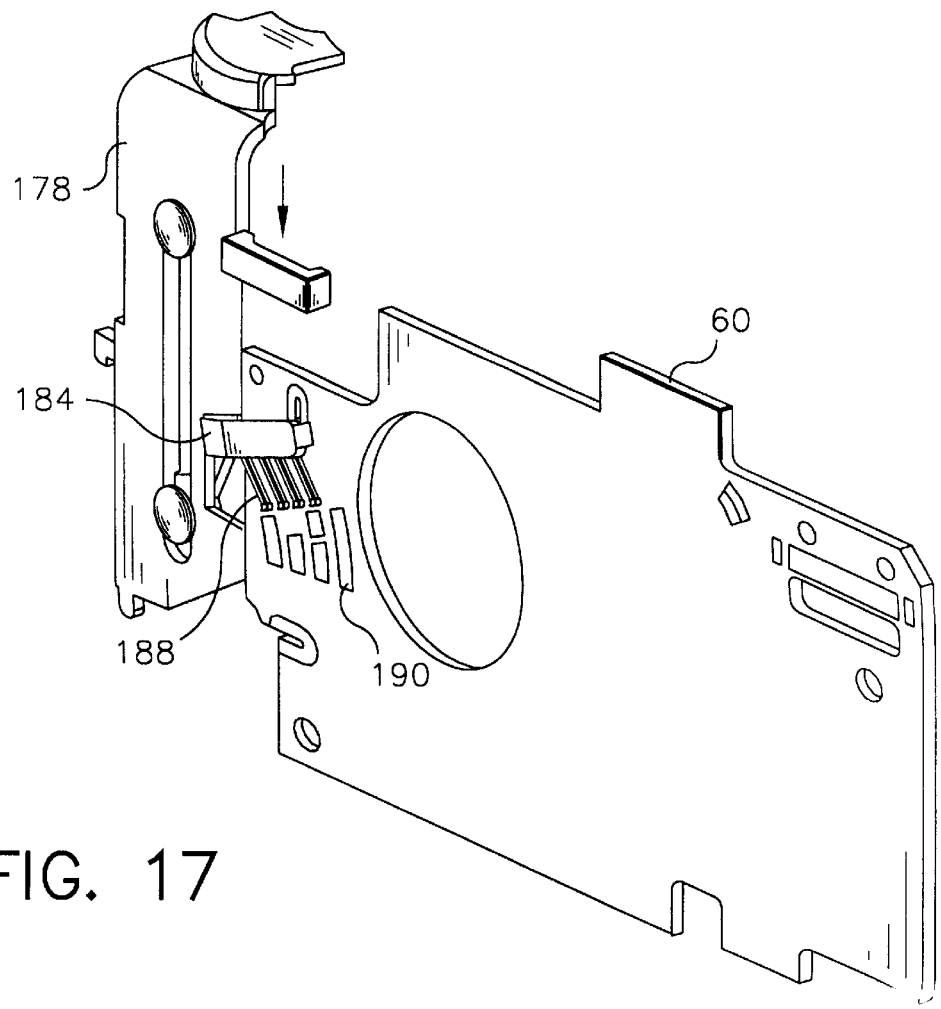
FIG. 17 is a front perspective view of a second embodiment of the invention that utilizes a pivot yoke to permit pivotal movement of an electrical contact arm of a shutter button assembly.
Figure 18:
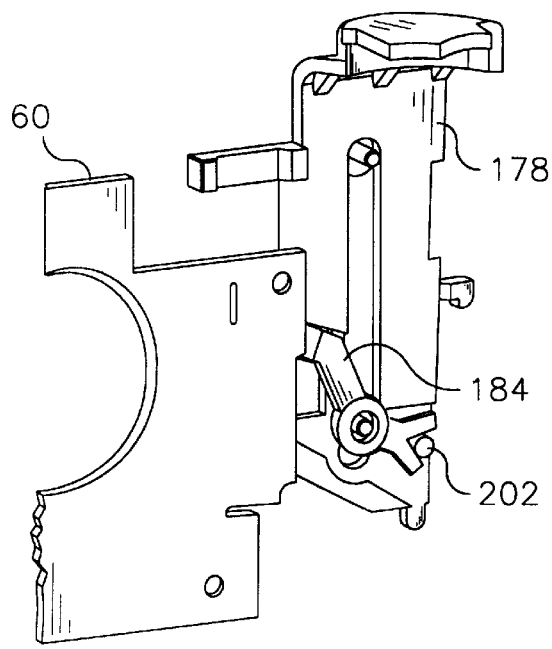
FIG. 18 is a rear perspective view of the embodiment shown in FIG. 17.
Figure 19:
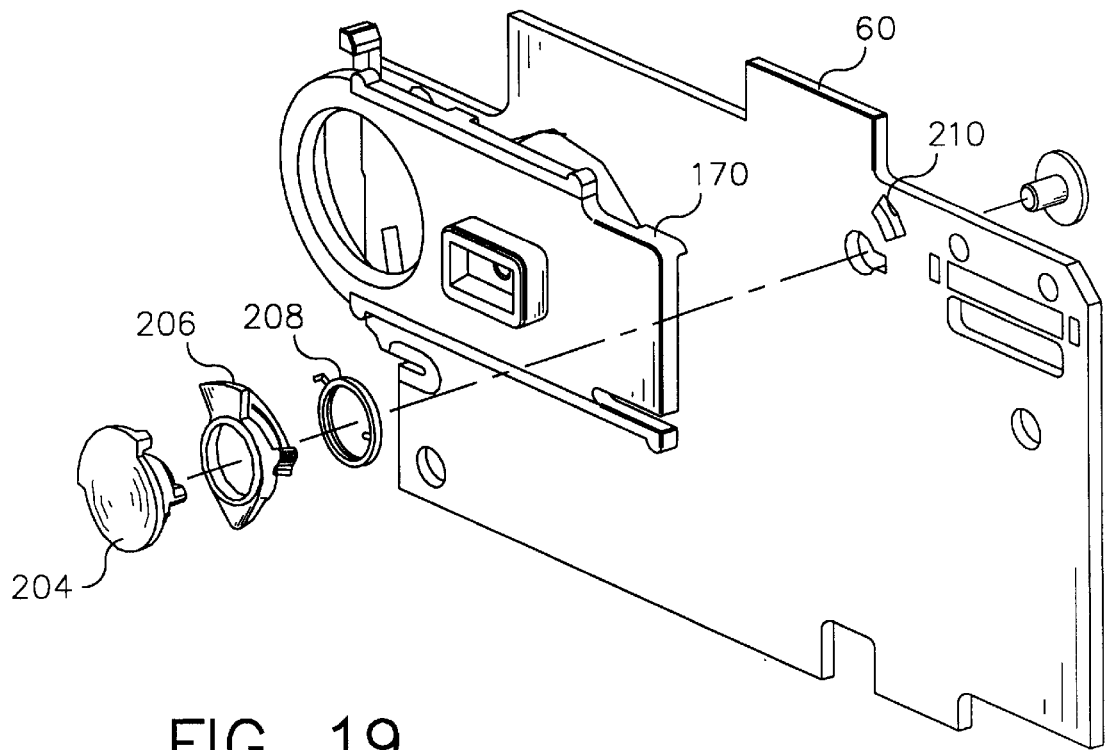
FIG. 19 is an exploded view of a third embodiment of the invention that incorporates a rotary switch.
Figure 20:
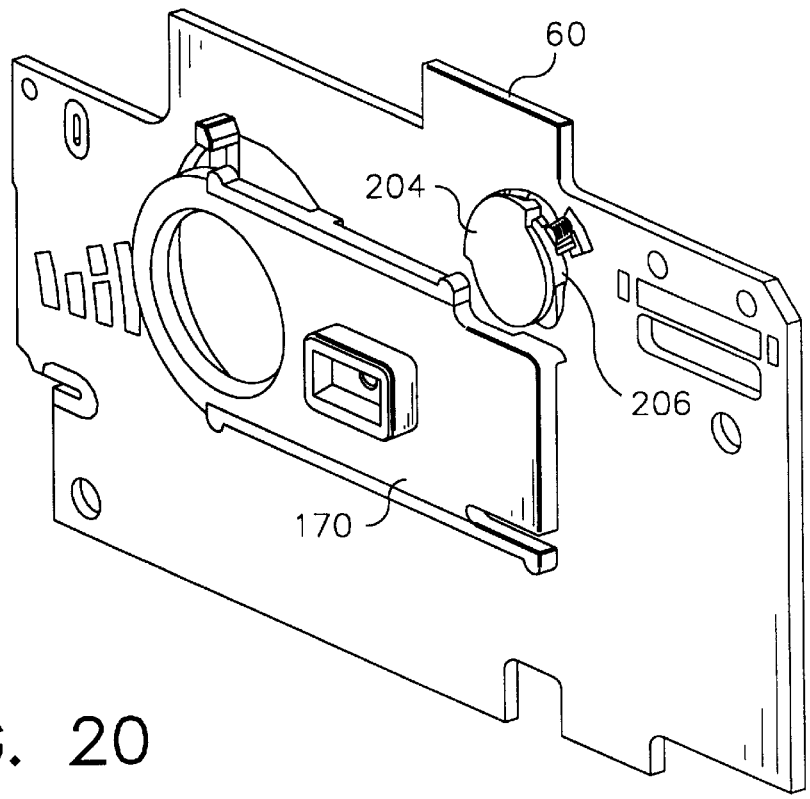
FIG. 20 is a perspective view of the embodiment illustrated in FIG. 19 with an internal slide member of a sliding lens cover making contact with the rotary switch.
Figure 21:
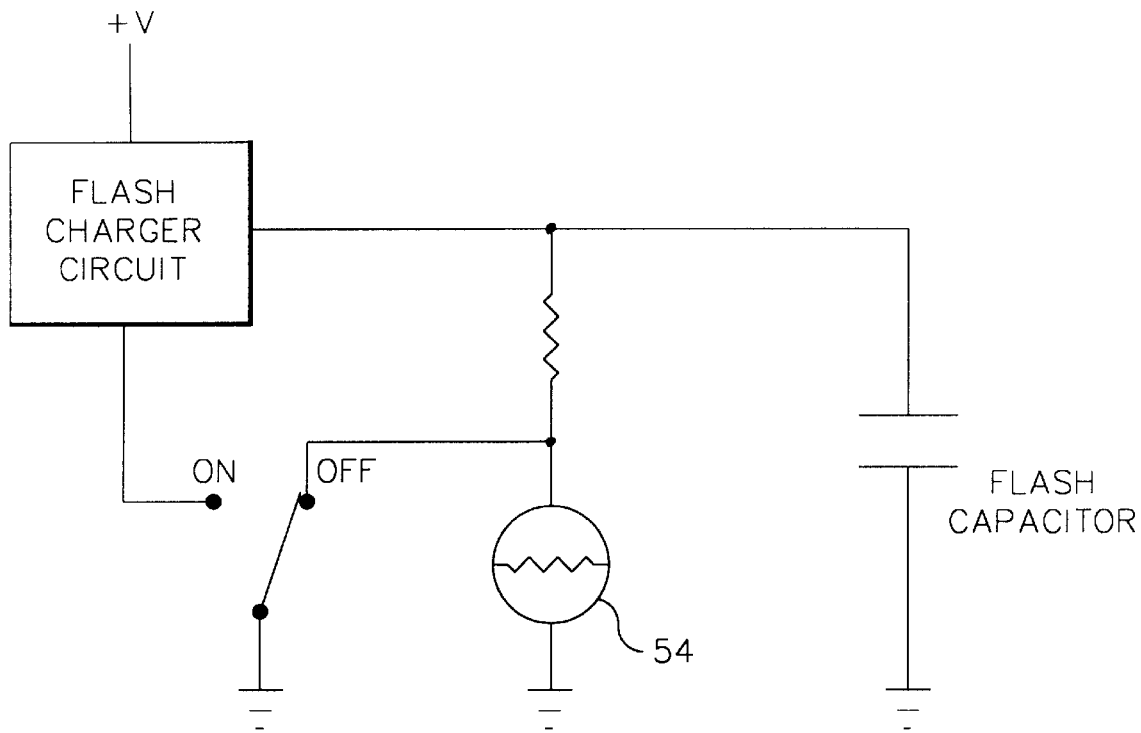
FIG. 21 is a circuit diagram illustrating the interconnection of a flash charger circuit and flash-ready indicator lamp with a flash operation control switch.

As shown in FIGS. 13 and 15, the vertical sliding member 178 is movably mounted to the main camera frame 36 and slides back and forth over protrusions 192 that fit into slots 194 provided in the vertical sliding member 178. The protrusions 192 are internally threaded to permit the insertion of a retainer screw (not shown) to prevent the vertical sliding member 178 from slipping off. A spring 196 is provided to bias the vertical sliding member 178 in an upward direction. The interior slide plate 170 of the sliding lens cover assembly 24 includes a retainer 198 that slides over the electrical contact arm 184 of the vertical sliding member 178. The retainer 198 controls the amount of contact pressure applied to the electrical contact wiper elements 188 provided on the electrical contact arm 184. The interior slide plate 170 also includes a shutter lock member 200 that interacts with the shutter actuation arm 182. Specifically, when the sliding lens cover assembly 24 is in the closed position, the shutter lock member 200 is located under the shutter actuation arm 182, thereby preventing the downward movement of the vertical sliding member 178 as shown in FIG. 13. Accordingly, the sliding lens cover assembly 24 interacts with the other camera components in the illustrated embodiment to provide a shutter lock, activation of the flash control circuitry, and to control the contact pressure applied to the electrical contact wiper elements 188. The invention has been described with reference to certain preferred embodiments thereof. It will be understood, however, that modifications and variations are possible within the scope of the appended claims. FIGS. 17 and 18, for example, illustrates a further embodiment of the invention in which the electrical contact arm 184 is attached to the vertical sliding member 178 of the shutter button assembly 18 via a pivot yoke 202. The pivot yoke 202 allows the electrical contact arm 184 to move in an arc, thereby allowing the electrical contact wiper elements 188 to sweep over arched or curved contact pads provided on the main printed circuit board 60. A still further embodiment of the invention is illustrated in FIGS. 19 and 20 in which the flash control switch 62 takes the form of a rotary switch including a fixed switch mount 204 that is coupled to the circuit board 60 and a rotating wiper assembly 206 that is spring loaded by a spring 208 and rotates to make contact with contact pads 210 provided on the circuit board 60 when contacted by the interior sliding member 170 as shown in FIG. 20.

The invention has been described in detail with particular reference to certain preferred embodiments thereof, but it will be understood that variations and modifications can be effected within the spirit and scope of the invention.

What is claimed is:

1. A camera comprising:

a main camera body;

a main circuit board attached to a front portion of the main camera body;

an auxiliary circuit board attached to a top portion of the main camera body;

a switch element located between the main camera body and the auxiliary circuit board, wherein the switch element contacts an electrical contact located on a bottom surface of the auxiliary circuit board; and at least one electrical component attached to a top surface of the auxiliary circuit board.

2. A camera as claimed in claim 1, further comprising battery leads located in slots formed in the auxiliary circuit board.

3. A camera as claimed in claim 2, wherein the battery leads and the slots are sized to create a mechanical snap fit between the battery leads and the slots.

4. A camera as claimed in claim 3, further comprising means for electrically connecting the battery leads to electrical contacts located on the auxiliary circuit board.

5. A camera as claimed in claim 1, wherein the electrical component comprises an indicator lamp that faces a back side of the camera.

6. A camera as claimed in claim 5, further comprising a red-eye reduction lamp attached to the top surface of the auxiliary circuit board, wherein the red-eye reduction lamp faces a front side of the camera.

7. A camera as claimed in claim 1, wherein the main circuit board includes electrical leads that abut electrical leads on the auxiliary circuit board; and wherein the abutted electrical leads are directly connected with a solder joint.

8. A camera as claimed in claim 1, wherein the main circuit board defines a plane that is substantially perpendicular to a plane defined by the auxiliary circuit board.

9. A camera comprising:

a main camera body;

a film door movably coupled to the main camera body, wherein said film door includes a stop mechanism;

a main circuit board attached to a front portion of the main camera body;

an auxiliary circuit board attached to a top portion of the main camera body;

a switch element, movable between a first position and a second position, located between the main camera body and the auxiliary circuit board, wherein the switch element includes a flexible slide element coupled to a bottom side of a main switch body that extends into a slot formed in the main camera body and electrical contacts coupled to a top side of the main switch body that contact with electrical contacts located on a bottom surface of the auxiliary circuit board;

biasing means for biasing the switch element to the first position; and at least one electrical component attached to a top surface of the auxiliary circuit board;

wherein the flexible slide element is stopped by the stop mechanism of the film door when the film door is closed and the switch element is moved to the second position; and wherein the stop mechanism is removed from a path of the flexible slide element when the film door is opened to permit the biasing means to move the switch element back to the first position.

10. A camera as claimed in claim 9, further comprising battery leads located in slots formed in the auxiliary circuit board.

11. A camera as claimed in claim 10, wherein the battery leads and the slots are sized to create a mechanical snap fit between the battery leads and the slots.

12. A camera as claimed in claim 11, further comprising means for electrically connecting the battery leads to electrical contacts located on the auxiliary circuit board.

13. A camera as claimed in claim 9, wherein the electrical component comprises an indicator lamp that faces a back side of the camera.

14. A camera as claimed in claim 13, further comprising a red-eye reduction lamp attached to the top surface of the auxiliary circuit board, wherein the red-eye reduction lamp faces a front side of the camera.

15. A camera as claimed in claim 9, wherein the main circuit board includes electrical leads that abut electrical leads on the auxiliary circuit board; and wherein the abutted electrical leads are directly connected with a solder joint.

16. A camera as claimed in claim 9, wherein the main circuit board defines a plane that is substantially perpendicular to a plane defined by the auxiliary circuit board.

17. A camera comprising:

a main camera body;

a main circuit board attached to a front portion of the main camera body;

an auxiliary circuit board attached to a top portion of the main camera body;

a switch element located between the main camera body and the auxiliary circuit board, wherein the switch element contacts an electrical contact located on a bottom surface of the auxiliary circuit board; and battery leads located in slots formed in the auxiliary circuit board.

18. A camera as claimed in claim 17, wherein the battery leads and the slots are sized to create a mechanical snap fit between the battery leads and the slots.

19. A camera as claimed in claim 18, further comprising means for electrically connecting the battery leads to electrical contacts located on the auxiliary circuit board.

20. A camera as claimed in claim 18, further comprising at least one electrical component located on a top surface of the auxiliary circuit board.

* * * * *